United States Patent [19]
Azad et al.

[11] Patent Number: 5,726,919
[45] Date of Patent: Mar. 10, 1998

[54] METHOD AND APPARATUS FOR MEASURING ELECTRON BEAM EFFECTIVE FOCUS

[75] Inventors: Farzin Homayoun Azad, Clifton Park; Robert David Lillquist, Niskayuna; David William Skelly, Burnt Hills, all of N.Y.

[73] Assignee: General Electric Company, Schenectady, N.Y.

[21] Appl. No.: 565,540

[22] Filed: Nov. 30, 1995

[51] Int. Cl.$^6$ .................. C23C 14/00; H01J 43/14; G21K 1/08
[52] U.S. Cl. ............... 364/578; 250/492.1; 250/492.22; 250/492.23; 250/492.3
[58] Field of Search ................. 364/488, 489, 364/490, 578; 250/492.1, 397, 492.22, 492.23, 492.3; 427/585, 457, 69, 70, 71; 219/121.1–121.21, 121.26; 324/171.3

[56] References Cited

U.S. PATENT DOCUMENTS

| | | | |
|---|---|---|---|
| 4,654,506 | 3/1987 | Sakamoto et al. | 219/112.26 |
| 4,656,331 | 4/1987 | Lillquist et al. | 219/121.47 |
| 4,783,169 | 11/1988 | Matthews et al. | 356/350 |
| 4,801,977 | 1/1989 | Ishitaka et al. | 355/30 |
| 5,019,961 | 5/1991 | Addesso et al. | 364/192 |
| 5,273,102 | 12/1993 | Lillquist et al. | 164/452 |
| 5,307,683 | 5/1994 | Phelps et al. | 73/708 |
| 5,483,036 | 1/1996 | Giedt et al. | 218/121.14 |
| 5,486,995 | 1/1996 | Kist et al. | 364/149 |

OTHER PUBLICATIONS

Laflamme et al., "Diagnostic Device Quantifies, Defines Geometric Characteristics of Electron Beam", Welding Journal, Oct. 1991, pp. 33–40.

*Primary Examiner*—Kevin J. Teska
*Assistant Examiner*—Herbert McNair
*Attorney, Agent, or Firm*—Tyler Maddry; Donald S. Ingraham

[57] ABSTRACT

A method and apparatus are provided for measuring effective focus of an electron beam directed at a target. The electron beam imparts heat flux into the target to effect a target surface temperature profile thereon. A mathematical process model is used to predict an initial iteration of the temperature profile based on operating beam parameters and based on heat transfer behavioral relationships of the target. The temperature profile is optically measured and then compared with the initial iteration to obtain a residual error therebetween. The predicted temperature profile is iterated by varying the beam focus operating parameter until the residual error is less than a predetermined value for determining the effective beam focus.

15 Claims, 3 Drawing Sheets

METHOD AND APPARATUS FOR MEASURING ELECTRON BEAM EFFECTIVE FOCUS

BACKGROUND OF THE INVENTION

The present invention relates generally to electron beam manufacturing processes, and, more specifically, to electron beam physical vapor deposition of a workpiece.

Electron beams are typically used in manufacturing processes to provide heat for cutting, welding, and vapor deposition. In conventionally known electron beam physical vapor deposition (EB-PVD), the electron beam is used to melt the surface of a suitable ingot material, such as zirconia, in a vacuum chamber containing a workpiece, with resulting zirconia vapors being dispersed for coating the workpiece. Zirconia is a thermally insulating ceramic material which finds use in gas turbine engines, for example, in which components such as combustor liners, shrouds, and airfoils are subject to hot combustion gases, with the zirconia coating being used for effectively thermally insulating these components for increasing useful life thereof.

The zirconia ingot must be uniformly and effectively heated and melted by the electron beam for maintaining stability of the resulting melt pool at the top thereof and for maximizing vaporization rate for coating the workpieces as quickly as possible. The rate of melting and vaporization of the ingot and the melt pool stability are controlled by key operating beam parameters including beam power, focus, scanning pattern, scanning frequency, and incidence angle of the electron beam on the target ingot. Various scanning patterns of the electron beam over the surface of the target are known and include for example two radially spaced apart concentric scan circles each having a specific beam focus and scanning frequency. The beam focus is defined or characterized by a Gaussian radius which is the radial distance form the beam centerline to where the energy density in the beam drops in value to 1/e of its peak value at the centerline.

In an exemplary arrangement, an ingot having an outer diameter of about 65 mm is suitably supported in a water cooled copper crucible, with a conventional electron beam gun being operated to effect the two-circle beam pattern on the target surface. The target absorbs heat from the electron beam and develops a melt pool on the surface thereof. The distribution of the vaporization rate on the pool surface is controlled by the vapor pressure of the ingot material at the prevailing surface temperature of the melt pool. The magnitude and distribution of the melt pool temperature is determined by the operating beam parameters, as well as thermophysical properties of the ingot material and the various modes of heat transfer encountered.

In order to qualify the EB-PVD process for a specific workpiece, trial and error is typically used to adjust the several operating beam parameters until a suitably high vaporization rate, and corresponding deposition rate on the workpiece, is obtained with acceptable melt pool stability. The desired melt pool surface temperature distribution or profile is usually relatively uniform from the center of the ingot to its circumference with the temperature smoothly and rapidly decreasing in magnitude upon reaching the relatively cool region adjacent to the crucible.

The electron beam focus is a key parameter which affects the melting and vaporization rate of the ingot and melt pool stability. Beam focus is conventionally controlled by varying the electrical current to focusing coils in the electron beam gun. However, the emerging vapor from the melt pool causes the incident electron beam to scatter which tends to broaden the effective beam focus into a distribution which is significantly different than that without the vapor.

The required beam parameters for a specific EB-PVD process may be initially determined by suitable analysis and empirical data, but the difference between the effective beam focus due to vapor scattering and the actual beam focus from the electron beam gun typically requires the relatively long and costly trial and error approach for maximizing vaporization rate while maintaining suitable melt pool stability. And, if it is desired to vary different ones of the beam parameters, similar process qualification must again be repeated.

Accordingly, it is desirable to measure the beam focus in situ within the working vacuum chamber since the beam focus has a significant impact on the melt pool surface temperature distribution or profile, on the vaporization rate, and on melt pool stability. In view of the typically hostile process environment within the vacuum chamber which is at relatively high temperature and includes the generated ingot vapors, is not practical to directly measure beam focus therein. Accordingly, it is an object of the present invention to measure the effective beam focus within the working chamber using an apparatus disposed outside the working chamber.

SUMMARY OF THE INVENTION

A method and apparatus are provided for measuring effective focus of an electron beam directed at a target. The electron beam imparts heat flux into the target to effect a target surface temperature profile thereon. A mathematical process model is used to predict an initial iteration of the temperature profile based on operating beam parameters and based on heat transfer behavioral relationships of the target. The temperature profile is optically measured and then compared with the initial iteration to obtain a residual error therebetween. The predicted temperature profile is iterated by varying the beam focus operating parameter until the residual error is less than a predetermined value for determining the effective beam focus.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

DESCRIPTION OF THE PREFERRED EMBODIMENT(S)

Figure 1:
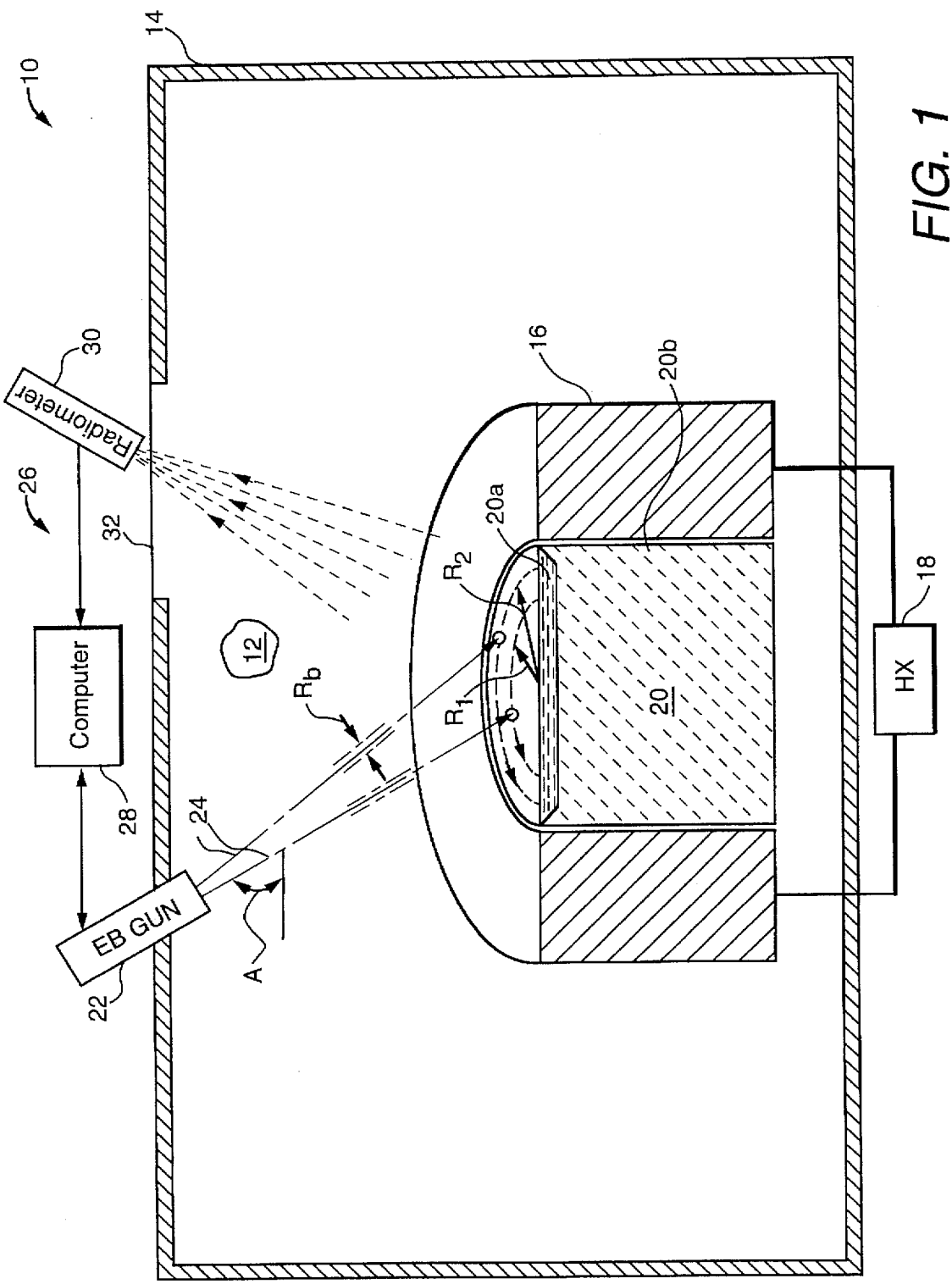
FIG. 1 is a schematic representative of an apparatus for effecting electron beam physical vapor deposition of a workpiece including means for measuring effective beam focus in accordance with an exemplary embodiment of the present invention.

Illustrated schematically in FIG. 1 is an electron beam physical vapor deposition (EB-PVD) apparatus 10 effective for depositing a vapor coating on an exemplary workpiece 12 in accordance with one embodiment of the present invention. The deposition apparatus 10 includes a working or vacuum chamber 14 in which is disposed a crucible 16 which is typically of metal construction and operatively joined with a cooling circuit 18 including a heat exchanger (HX) for example. Disposed in the crucible 16 is an ingot or target 20 formed of a desired material, such as zirconia, which is used for vapor deposition of the workpiece 12.

An electron beam gun 22 is suitably mounted to the chamber 14 for directing an electron beam 24 at the top surface of the target 20 for melting the surface and forming a shallow melt pool 20a which floats atop the unmolten solid substrate 20b therebelow.

The deposition apparatus 10 as described above is conventional in construction and operation. The electron beam gun 22 is represented schematically and conventionally includes various components for controlling its operation and the resulting electron beam 24. Key operating parameters of the gun 22 include beam power, beam focus, beam pattern, scanning frequency of the pattern, and incidence angle A of the beam on the target 20.

Any suitable beam pattern and scanning frequency may be used, with a conventional two-circle pattern being illustrated. The gun 22 is conventionally operated to form an inner scan circle of radius $R_1$ and a concentric outer scan circle of radius $R_2$. The inner circle is scanned at a suitable first frequency of about 300 hertz for example, and the outer circle is scanned at a second frequency of about 60 hertz for example. In this example, the target 20 has an outer diameter of about 65 mm, and the first radius $R_1$ is about 15.9 mm, and the second radius $R_2$ is about 31.8 mm.

As indicated above, a key parameter which is used in controlling the melting and vaporization rates of the target 20 and maintaining suitable melt pool stability is beam focus. The beam focus is defined or characterized by the Gaussian radius $R_b$ which is the radial distance from the beam centerline to the point where the energy density of the beam 24 drops to 1/e of the peak value at the centerline. The beam focus $R_b$ for both the inner and outer scan circles is about 30 mm in this example. The beam focus $R_b$ is conventionally controlled by the specific value of the electrical current provided to conventional focusing coils in the gun 22 and may be varied as desired.

The electron beam gun 22 illustrated in FIG. 1 may be conventionally operated using the two-circle scanning pattern illustrated therein to effect a substantially uniform surface temperature distribution or profile of the melt pool 20a having a maximum value at the target longitudinal centerline axis and decreasing with a relatively small gradient radially outwardly therefrom up to the circumference of the target 20 wherein the temperature smoothly and rapidly decreases due to the cooling effects of the cooled crucible 16. An exemplary first temperature profile $T_1$ is analytically predicted or calculated in accordance with the present invention, and illustrated in solid line in FIG. 2, for the exemplary two-circle scanning pattern described above for a beam power of 112 kW and beam focus $R_b$ of 30 mm. The first temperature profile varies from a maximum of about 3,600° K at the center of the target 20 and gradually decreases about 200° K at a radial position of about 30 mm, which is adjacent to the perimeter of the target 20, after which the temperature decreases abruptly.

Figure 2:
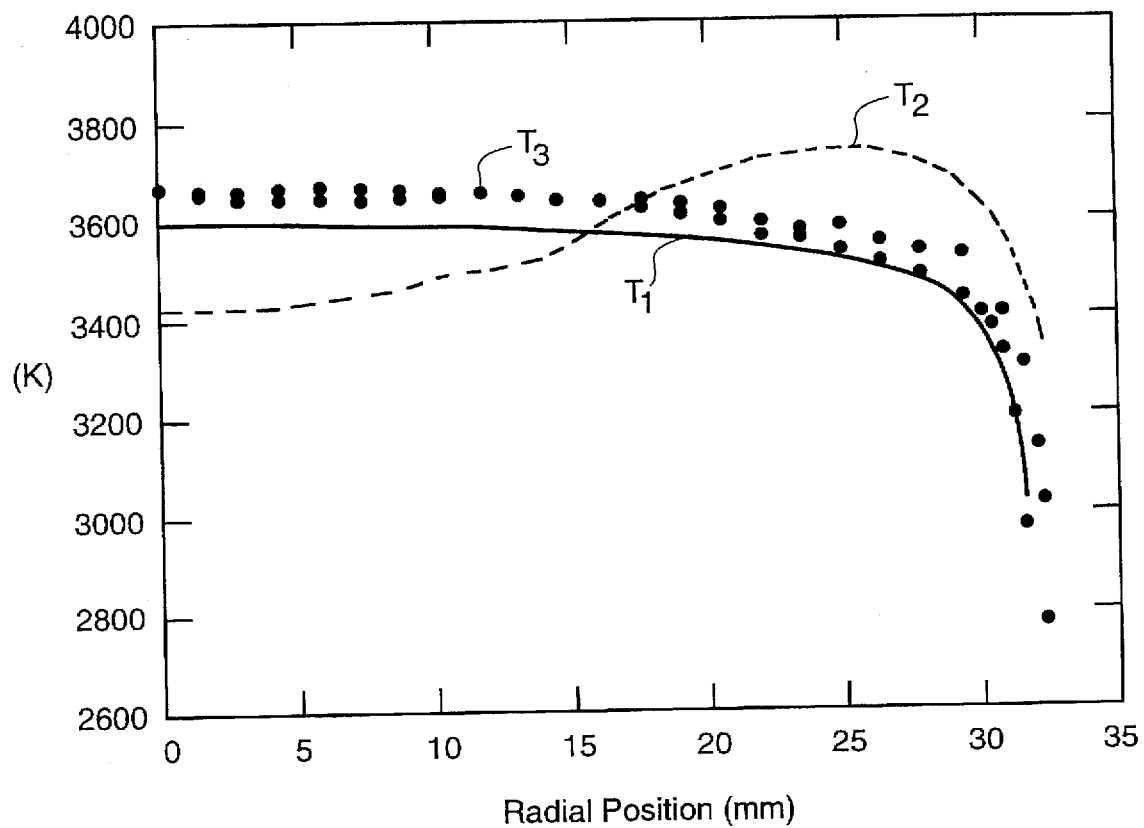
FIG. 2 is a graph plotting temperature distribution of a melt pool formed atop a target ingot of the apparatus illustrated in FIG. 1 radially outwardly from its centerline axis.

FIG. 2 also plots in dashed line another analytically predicted second temperature profile $T_2$ of the same two-circle scanning pattern example except that the beam focus $R_b$ is reduced in half to 15 mm. This change in beam focus clearly indicates its ability to substantially change the resulting melt pool surface temperature profile, which in this case has a local minimum value of about 3,400° K near the target centerline and increases approximately 400° K at the radially outer position of about 25 mm followed in turn by a rapid decrease in temperature to the perimeter of the target. The two predicted temperature profiles $T_1$ and $T_2$ illustrated in FIG. 2 merely confirm the sensitivity of the deposition apparatus 10 illustrated in FIG. 1 to the beam focus $R_b$, while the other key parameters and process geometry are held constant.

This is significant since during the physical vapor deposition process, the emerging vapors scatter the incident electron beam 24 and thereby effectively change the beam focus. If the beam focus is different than originally intended, the resulting melt pool surface temperature profile will also be different, and will therefore affect the vaporization rate and melt pool stability.

In accordance with the present invention, the conventional deposition apparatus 10 may be suitably modified to further include an apparatus 26, as illustrated in FIG. 1, for determining or measuring in situ the effective focus of the electron beam 24 directed inside the chamber 14 at the target 20 which will take into effect the resulting vapors dispersed from the melt pool 20a. The temperature measuring apparatus 26 includes a conventional programmable digital computer 28 which contains suitable software defining a mathematical process model to predict an initial iteration of the melt pool temperature profile based on the operating parameters described above, as well as based on thermophysical properties or heat transfer behavioral relationships of the target 20 in the crucible 16 in the environment of the chamber 14. The process model may vary in sophistication from relatively simple to relatively complex depending upon the degree of accuracy desired. In the preferred embodiment, the process model models the EB-PVD process with the key operating beam parameters introduced above, e.g., beam power, beam focus $R_b$ as represented by the corresponding electrical current in the gun 22, scanning pattern, scanning frequency, and incidence angle A. Desired initial values of these parameters may be selected in a conventional manner for a specific deposition process.

In the specific application of the present invention, the target 20 is melted at its surface to develop the melt pool 20a which is considered in the process model. Accordingly, a more sophisticated process model includes analysis of heat conduction in the melt pool 20a and in the unmolten target substrate 20b therebelow; buoyancy and surface tension driven heat convection in the melt pool 20a; and heat radiation from the target 20 which includes radiation from the surface of the melt pool 20a and from the lateral surface of the target 20. The fluid mechanics behavioral relationships of the melt pool 20a are also further included since these affect the resulting melt pool surface temperature profile.

General purpose, computer implemented heat transfer and fluid flow software is commercially available in various forms which may be used for modeling the EB-PVD process illustrated in FIG. 1 to predict the melt pool surface temperature profile. Exemplary software is known as "FIDAP" commercially available from the Fluid Dynamic International Company of Evanston, Ill. Other suitable analytical codes may be used depending upon the accuracy desired, and specific process models may be individually created and tailored if desired.

Figure 3:
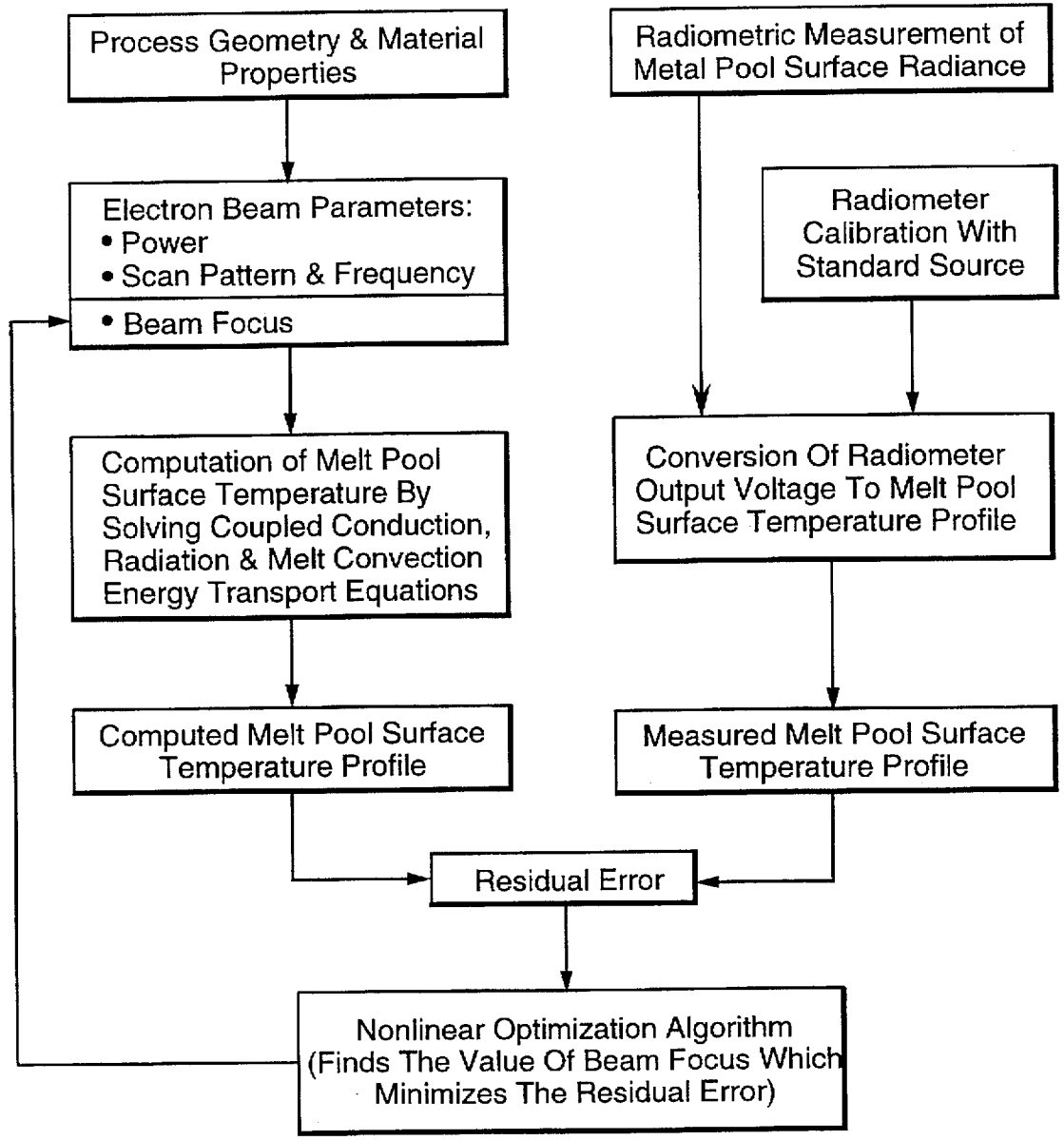
FIG. 3 is a flowchart representation of a method for measuring effective focus of the electron beam illustrated in FIG. 1 in accordance with an exemplary embodiment of the present invention.

An exemplary method of measuring the effective beam focus using the apparatus 26 illustrated in FIG. 1 is shown in flowchart form in FIG. 3. The process model includes the geometry and material properties of the various components including the target 20 and crucible 16 used in the deposition process. The conventional electron beam operating parameters including power, scan pattern and frequency, beam focus, as well as incidence angle, are also used for input into the process model. The melt pool surface temperature profile may then be computed in the computer 28 by solving the coupled conduction, radiation, and melt convection energy transport equations contained in the software implemented process model. Two examples of computed melt pool surface temperature profiles are illustrated in FIG. 2 as indicated above, and are labeled $T_1$ and $T_2$.

The temperature measuring apparatus 26 illustrated in FIG. 1 further includes suitable means for optically measuring the actual temperature profile of the surface of the melt pool 20a which may be accomplished by using a conventional radiometer 30. The radiometer 30 is suitably mounted outside the chamber 14, with the chamber 14 preferably including a suitable window 32 which is transparent for allowing the radiometer 30 to scan the surface of the melt pool 20a and measure or record the temperature profile thereof.

In operation, the radiometer 30 illustrated in FIG. 1 is conventionally calibrated with a standard calibration source, and then is suitably scanned across the melt pool 20a for observing the radiance thereof. The melt pool surface temperature profile is conventionally obtained by suitably converting the radiometer output voltage into corresponding data points as shown for example in the measured temperature profile $T_3$ illustrated in FIG. 2.

In the example introduced above, a conventional infrared radiometer 30 provides a measured or third temperature profile designated $T_3$ as represented by the locus of individual temperature measurements along the radius of the target 20. The data illustrated in FIG. 2 show a relatively close approximation between the measured temperature profile $T_3$ and the corresponding analytically predicted first temperature profile $T_1$ for the same operating beam parameters including the beam focus $R_b$ of 30 mm. The FIG. 2 graph confirms that a process model may be effectively defined to fairly accurately represent the EB-PVD process illustrated in FIG. 1 and accurately predict the corresponding melt pool surface temperature profile.

In a typical deposition process, the beam parameters are conventionally selected and known, including the specific value of the electrical beam focusing current resulting in a nominal beam focus $R_b$. Without the scattering effects of the target vapor as indicated above, the predicted temperature profile such as the first profile $T_1$ illustrated in FIG. 2 will accurately compare with the corresponding measured temperature such as $T_3$. Since the scattering effect of the electron beam 24 due to the target vapor in the EB-PVD process effectively changes the beam focus $R_b$, the resulting temperature profile will in turn also be changed.

Accordingly, in order to measure the melt surface temperature through the target vapor, the radiometer 30 itself must be effective through the vapors, and is therefore preferably an infrared radiometer. Next, the measured temperature profile of the melt pool 20a using the radiometer 30 must be compared to the initial temperature profile calculated in the process model to obtain a residual error representing the temperature difference between corresponding temperature measuring points. This comparing step is readily accomplished in the computer 28 to determine whether the residual error is less than a predetermined low value indicating a high degree of correspondence between the calculated and measured temperature profiles.

Since vapor scattering of the electron beam 24 significantly alters the resulting temperature profile, the initial calculation of the temperature profile using the nominal beam focus will ordinarily result in a relatively large residual error indicating the lack of correspondence between the predicted profile and the measured profile. Since all of the beam parameters, except for the actual beam focus, are predetermined and substantially constant values, the process model may be conventionally iterated by suitably varying the beam focus parameter and calculating the resulting predicted temperature profile, and then comparing each calculated temperature profile iteration with the actual measured temperature profile.

Various conventional techniques are known which may be implemented in the computer 28 for iterating to convergence two data matrices such as those represented by the actual measured temperature using the radiometer 30 and the predicted temperature. For example, conventionally nonlinear optimization algorithms are known in which the beam focus parameter may be systematically varied for reducing the residual error until a specific value of the beam focus is obtained which minimizes the residual error within the desired predetermined value indicating correspondence between the predicted temperature profile and the measured temperature profile. In this way, the resulting beam focus value determined in the process model represents the effective beam focus resulting in the corresponding predicted temperature profile which matches the actually measured temperature profile.

In this way, an in situ method of relating the effective beam focus to input parameters of the process model, which represents the operating beam parameters, is effected which characterizes the effect of the beam focus on the melt pool surface temperature distribution and resulting vaporization rate. By determining the effective beam focus in accordance with the above method, the corresponding actual heat flux of the electron beam incident on the melt pool 20a is effectively determined. In other words, the mathematical process model relates the radiometric measurements of the melt surface temperature profile to the actual incident heat flux distribution of the pool 20a.

The temperature measuring apparatus 26 illustrated in FIG. 1 and the corresponding method presented in the FIG. 3 flowchart therefore allow in situ measurement of the effective beam focus of the laser beam 24 as affected by the target vapor actually occurring during the vapor deposition process on the workpiece 12. Since the actual temperature profile of the melt pool 20a may be readily determined using the radiometer 30, the beam focusing current of the electron beam gun 22 may be adjusted as required to vary the resulting melt pool surface temperature profile until it matches any suitable temperature profile selected for maximizing vapor deposition of the workpiece 12 while maintaining suitable melt pool stability. Since the beam focus is a primary parameter which affects the resulting temperature profile, the computer 28 illustrated in FIG. 1 may be operatively joined to the electron beam gun 22 for adjusting the beam focusing current to change the temperature profile as desired. And, since all of the beam parameters in different ways affect the resulting temperature profile, any one of the beam parameters in the gun 22 may be changed to in-turn change the target surface temperature profile.

Accordingly, a significant advantage of the present invention is that changes in the vapor deposition process may be readily effected by changing desired ones of the beam parameters, with the resulting effect thereof being readily determined in the temperature profile measured by the radiometer 30. The effect of varying the different beam parameters including beam focus may then be used for selecting specific values of the parameters for obtaining the preferred temperature profile for maximizing vaporization rate while maintaining suitable pool stability. The apparatus 26 and method therefore allow physical vapor deposition processes to be more quickly developed and qualified as compared to the use of conventional trial and error.

Furthermore, as indicated above it is possible that the method may be operated in real time to continually control operation of the electron beam gun 22 by adjusting the beam focus electrical current for example. Improvements in electron beam physical vapor deposition processing may therefore be obtained over conventional processes.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention as defined and differentiated in the following claims:

We claim:

1. A method of measuring effective focus of an electron beam directed at a target from an electron beam gun having beam parameters including power, focus, scanning pattern, scanning frequency, and incidence angle, for imparting heat flux into said target to effect a target surface temperature profile, comprising:

providing a mathematical process model to predict an initial iteration of said temperature profile based on said beam parameters, and based on heat transfer behavioral relationships of said target;

optically measuring said temperature profile;

comparing said predicted and measured temperature profiles to obtain a residual error therebetween; and iterating said predicted temperature profile by varying said beam focus parameter and repeating said comparing step until said residual error is less than a predetermined value to determine said effective beam focus.

2. A method according to claim 1 wherein said temperature profile measuring step uses radiometry.

3. A method according to claim 2 further comprising:

a workpiece disposed adjacent to said target; and operating said electron beam gun to melt said target surface and form a melt pool for dispersing vapor therefrom for physical vapor deposition on said workpiece.

4. A method according to claim 3 wherein said temperature profile measuring step uses infrared radiometry to measure said profile through said vapor.

5. A method according to claim 4 further comprising adjusting at least one of said beam parameters in said gun to change said target surface temperature profile.

6. A method according to claim 5 wherein said beam focus parameter in said gun is changed by adjusting beam focusing current to change said target surface temperature profile.

7. A method according to claim 3 wherein said process model further comprises fluid mechanics behavioral relationships of said melt pool.

8. A method according to claim 7 wherein said process model further comprises heat conduction in said melt pool and in an unmolten target substrate therebelow; buoyancy and surface tension driven heat convection in said melt pool; and heat radiation from said target.

9. An apparatus for measuring effective focus of an electron beam directed at a target from an electron beam gun having operating beam parameters including power, focus, scanning pattern, scanning frequency, and incidence angle for imparting heat flux into said target to effect a target surface temperature profile, comprising:

a computer containing a mathematical process model to predict an initial iteration of said temperature profile based on said beam parameters and based on heat transfer behavioral relationships of said target;

a radiometer operatively joined to said computer for optically measuring said temperature profile and being effective to provide said measured temperature profile thereto;

said computer being effective for comparing said predicted and measured temperature profiles to obtain a residual error therebetween; and said computer being further effective for iterating said predicted temperature profile by varying said beam focus parameter and repeating said comparison until said residual error is less than a predetermined value to determine said effective beam focus.

10. An apparatus according to claim 9 further comprising:

a workpiece disposed adjacent to said target; and wherein said computer is operatively joined to said electron beam gun and is effective for operating said gun to melt said target surface and form a melt pool for dispersing vapor therefrom for physical vapor deposition on said workpiece.

11. An apparatus according to claim 10 wherein said radiometer is an infrared radiometer.

12. An apparatus according to claim 11 wherein said computer is effective for adjusting at least one of said beam parameters in said gun to change said target surface temperature profile.

13. An apparatus according to claim 12 wherein said beam focus parameter in said gun is changed by adjusting beam focusing current to change said target surface temperature profile.

14. An apparatus according to claim 10 wherein said process model further comprises fluid mechanics behavioral relationships of said melt pool.

15. An apparatus according to claim 14 wherein said process model further comprises heat conduction in said melt pool and in an unmolten target substrate therebelow; buoyancy and surface tension driven heat convection in said melt pool; and heat radiation from said target.

* * * * *